United States Patent
Watanabe

(10) Patent No.: US 6,281,529 B1
(45) Date of Patent: *Aug. 28, 2001

(54) SEMICONDUCTOR DEVICE HAVING OPTIMIZED INPUT/OUTPUT CELLS

(75) Inventor: Masatoshi Watanabe, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/679,566

(22) Filed: Jul. 15, 1996

(30) Foreign Application Priority Data

Oct. 31, 1995 (JP) .................................................. 7-283955

(51) Int. Cl.[7] .................................................. H01L 27/10
(52) U.S. Cl. .......................... 257/204; 257/206; 257/207
(58) Field of Search .................................. 257/203, 207, 257/211, 204, 206

(56) References Cited

U.S. PATENT DOCUMENTS

| | | | |
|---|---|---|---|
| 4,780,846 | * 10/1988 | Tanabe et al. | 365/63 |
| 4,825,107 | * 4/1989 | Naganuma et al. | 307/465 |
| 4,992,845 | * 2/1991 | Arakawa et al. | 357/42 |
| 4,994,866 | * 2/1991 | Awano | 257/190 |
| 5,087,955 | * 2/1992 | Futami | 257/355 |
| 5,162,893 | * 11/1992 | Okano | 257/203 |
| 5,365,091 | * 11/1994 | Yamagishi | 257/203 |
| 5,552,618 | * 9/1996 | Taniguchi et al. | 257/207 |

FOREIGN PATENT DOCUMENTS

| | | | |
|---|---|---|---|
| 249988 | * 12/1987 | (EP) | 257/211 |
| 563973 | * 10/1993 | (EP) | 257/203 |
| 63-207149 | 8/1988 | (JP) . | |

* cited by examiner

*Primary Examiner*—Sara Crane
(74) *Attorney, Agent, or Firm*—Arent, Fox, Kintner, Plotkin, Kahn PLLC

(57) ABSTRACT

A semiconductor device includes cell areas laid out along a periphery of the device. A plurality of transistors are formed in each cell area, and are separated into at least three transistor groups arranged in a direction perpendicular to a circumferential direction of the semiconductor device. Each transistor group is connected to a high-potential power supply or a low-potential power supply. The semiconductor device has at least one interconnection line common to both the transistor group connected to the high-potential power supply and the transistor group connected to the low-potential power supply. The interconnection line serves to connect those transistor groups to external pads.

10 Claims, 10 Drawing Sheets

US 6,281,529 B1

SEMICONDUCTOR DEVICE HAVING OPTIMIZED INPUT/OUTPUT CELLS

BACKGROUND OF THE INVENTION

1. Field of the Invention

The present invention relates to a semiconductor integrated circuit (IC) device, and, more particularly, to a technique for accomplishing a multipin structure which provides a greater number of external pins.

2. Description of the Related Art

As semiconductor fabrication process has advanced, the integration architecture of semiconductor devices has become greater and the number of circuits formed on a single semiconductor chip tends to increase. Accordingly, there is a demand for a greater number of external pins (multipin structure). The multipin structure requires that the input/output pad pitch arranged along the periphery of a semiconductor chip should be shortened. In addition, it is necessary to shorten the widths of the input/output cell areas, which are arranged along the periphery of a semiconductor chip and lie to the interior of the pads. Once the input/output cell areas are formed, input/output circuits are constructed within the cells.

A gate array is one type of semiconductor integrated circuit (IC) device. FIG. 1 illustrates an output circuit 101 which is formed in one input/output cell area 100 in a conventional gate array. Each input/output cell area 100 has four NMOS transistors 102 and four PMOS transistors 103. In FIG. 1, the gates of the individual MOS transistors are shown as the NMOS transistors 102 and the PMOS transistors 103.

The four NMOS transistors 102 are arranged horizontally with respect to the width of the input/output cell area 100 or in the layout direction of a plurality of input/output cell areas 100. The four PMOS transistors 103 are likewise arranged horizontally with respect to the width of the input/output cell area 100. The individual NMOS transistors 102 and their associated PMOS transistors 103 are laid out in the height direction of the input/output cell area 100 or in a direction that is perpendicular to the layout direction of the input/output cell area 100.

As illustrated, an interconnection line 104 is provided to the sources of the two adjoining NMOS transistors 102. The interconnection line 104 is connected to a power supply line 106, which is provided above the line 104 and is connected to a low-potential power supply $V_{SS}$. An interconnection line 105 is provided on the sources of the two adjoining PMOS transistors 103. The interconnection line 105 is connected to a power supply line 107, which is provided above the line 105 and is connected to a high-potential power supply $V_{DD}$. The drains of the NMOS transistor 102 and PMOS transistor 103 which are associated with each other are connected to external pads (not shown for ease of illustration) via two aluminum interconnection lines 108.

FIG. 2A presents a circuit diagram of the output circuit 101 which is formed in the input/output cell area 100 shown in FIG. 1, and FIG. 2B presents an equivalent circuit diagram of the output circuit 101 expressed in the form of a layout image. Since the four NMOS transistors 102 in FIG. 1 are connected in parallel, those four transistors are illustrated as a single NMOS transistor 102 in FIGS. 2A and 2B. Likewise, since the four PMOS transistors 103 in FIG. 1 are connected in parallel, those four transistors are expressed as a single PMOS transistor 103 in FIGS. 2A and 2B.

In the circuit shown in FIG. 2B, when the PMOS transistor 103 turns on and the NMOS transistor 102 turns off in response to an L-level input signal, a charge current $I_{OH}$ is supplied to output loads CLU and CLD via an external pad 109 from the high-potential power supply $V_{DD}$. When the PMOS transistor 103 turns off and the NMOS transistor 102 turns on in response to an H-level input signal, on the other hand, a discharge current $I_{OL}$ flows in through the external pad 109 from the output loads CLU and CLD.

In such a case where the output circuit is constituted by using the input/output cell area, the size of the input/output cell area 100 is determined through the following three basic steps. First, the number of PMOS and NMOS transistors needed to drive the output loads which are connected to an external pad is determined through a simulation. Secondly, the MOS transistors are laid out while meeting the masking design standards which are used in the exposure process of the MOS transistors. Thirdly, by executing the current analysis at the time the output circuit operates, the width of the aluminum interconnection line is so determined as to secure the electromigration resistance. As pattern miniaturization is increased due to improved process technology, the width CW0 of each input/output cell area 100 can be made narrower and the layout pitches between a plurality of input/output cell areas are made shorter.

The conventional input/output cell area 100 comprises a single stage of NMOS transistors 102 and a single stage of PMOS transistors 103. The width W0 of the aluminum interconnection line 108 has therefore been determined based on direct current (DC) analysis. More specifically, the width W0 of the aluminum interconnection line has been selected based on the amount of the current flowing in from an external pad 109 when the four NMOS transistors 102 are turned on, or the current flowing out to the external pad 109 when the four PMOS transistors 103 are turned on.

This design scheme suffers from its inability to withstand the electromigration resistance. The line width W0 is therefore determined based upon the required resistance against a DC current flowing along the aluminum interconnection line 108 on the PMOS transistor 103. In this respect, the line width W0 of the aluminum interconnection line 108 is set unnecessarily large. Because the width CW0 of the input/output cell area is determined based on the number of the aluminum interconnection lines and the width of each line, the reduction of width CW0 of the input/output cell area is limited. Consequently, the layout pitches between the input/output cell areas may not be reduced as desired, and thus there is a limit to increasing the number of input/output cell areas. This shortcoming hinders the number of external pins that conventional multipin architectures are able to provide.

SUMMARY OF THE INVENTION

Broadly speaking, the present invention relates to a semiconductor device that is designed having reduced common line widths for connection to external pads while sufficiently considering the electromigration resistance, thereby accomplishing a multipin architecture capable of supporting a greater number of external pads.

A semiconductor device according to this invention includes a plurality of cell areas laid out along a periphery of the semiconductor device, and a plurality of transistors formed in each cell area. The transistors in each cell area are classified into at least three transistor groups, which are arranged in a direction perpendicular to the circumferential direction of the semiconductor device. Each of the at least three transistor groups is connected to one of a high-potential power supply and a low-potential power supply. The semiconductor device has at least one line which is common to the transistor group connected to the high-potential power supply and the transistor group connected to the low-potential power supply and serves to connect those transistor groups to external pads.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best. be understood by reference to the following description of the presently preferred embodiments together with the accompanying drawings.

DETAILED DESCRIPTION OF THE PREFERRED EMBODIMENTS

First Embodiment

Figure 1:
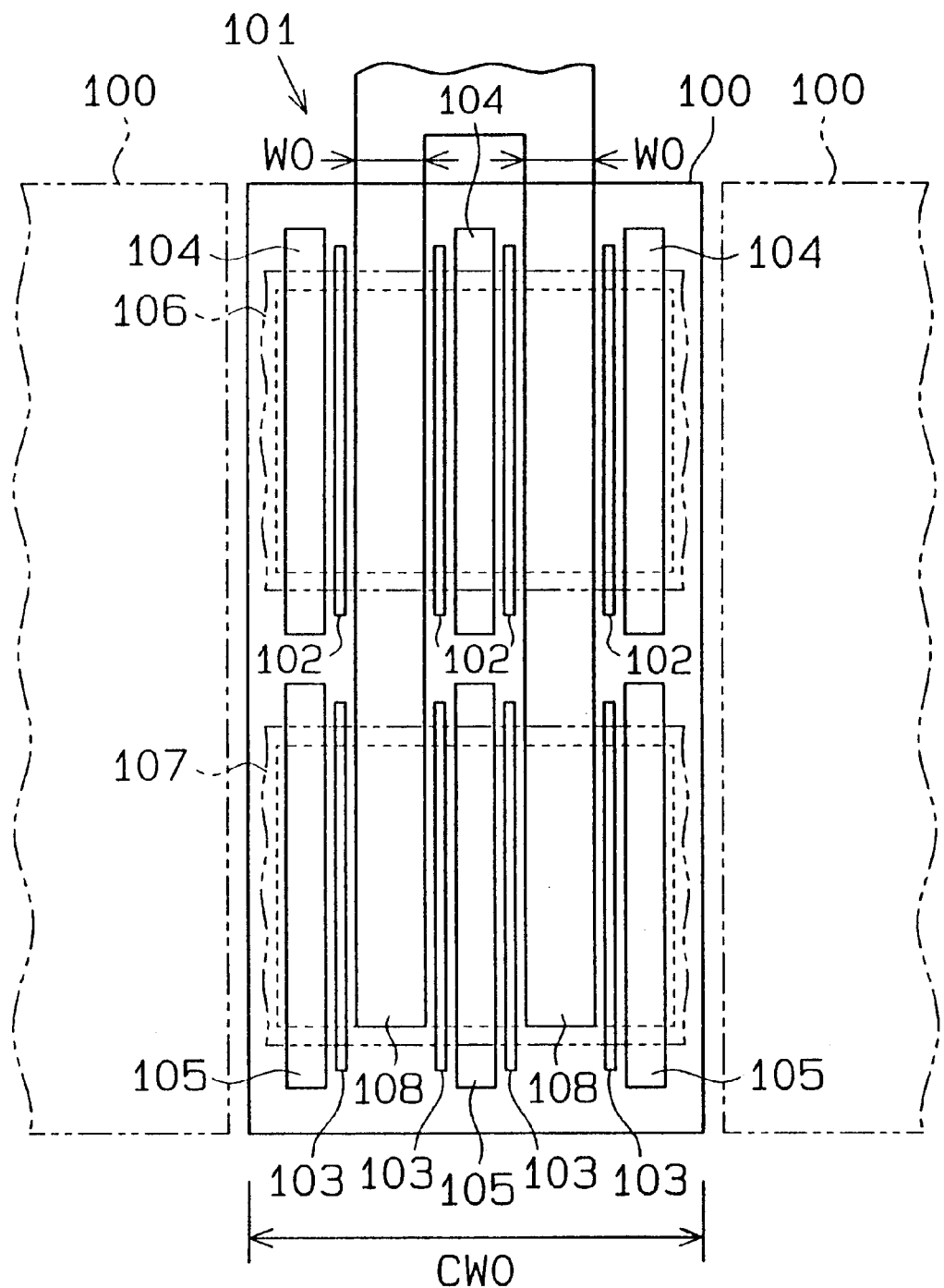
FIG. 1 is a plan view illustrating an input/output cell area in a conventional gate array.
Figure 2A:
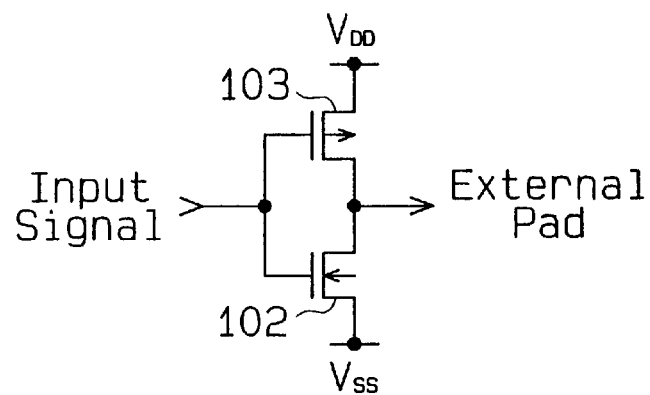
FIG. 2A is a circuit diagram of a conventional output circuit.
Figure 2B:
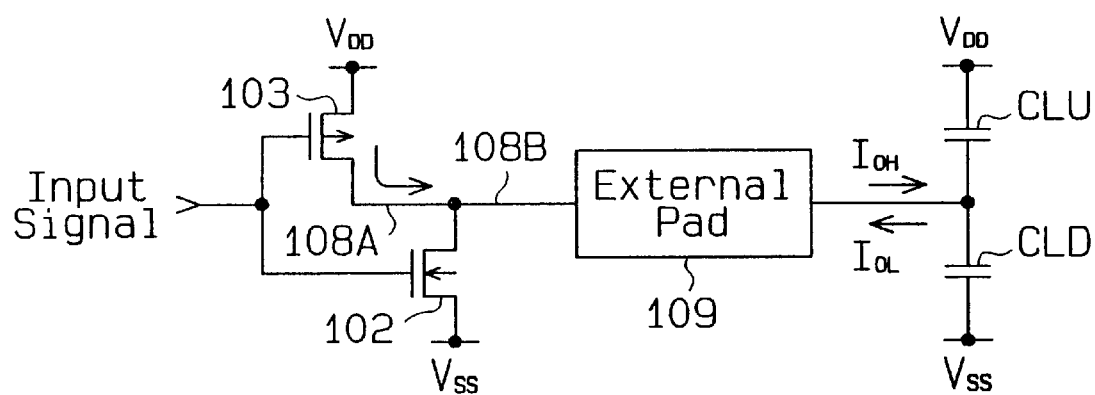
FIG. 2B is an equivalent circuit diagram which reflects the layout image of the output circuit in FIG. 2A.
Figure 3:
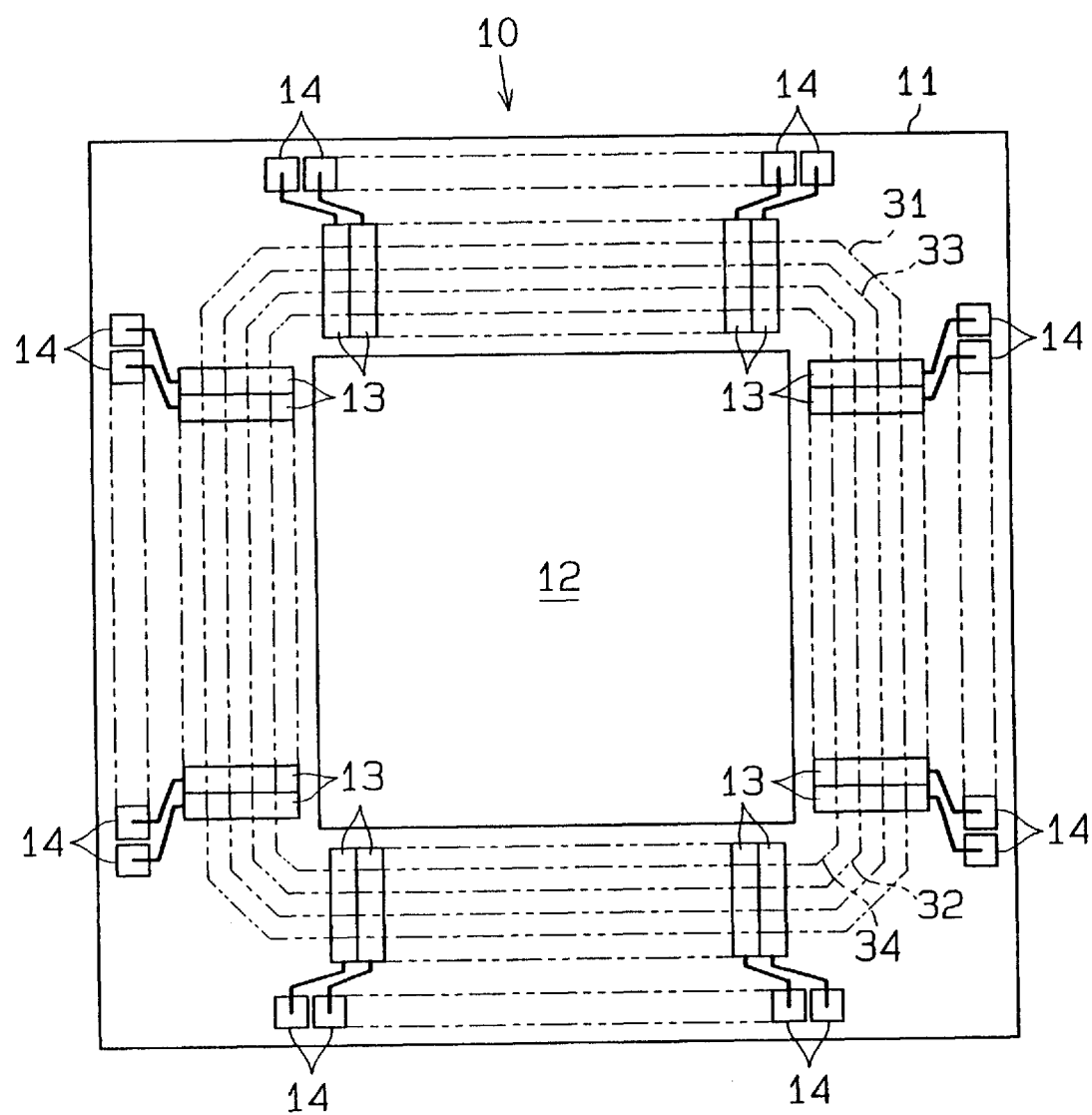
FIG. 3 is a layout diagram of a semiconductor device according to a first embodiment of the present invention.

The first embodiment of this invention will be now described with reference to FIGS. 3 through 6B. FIG. 3 shows a gate array 10 of a semiconductor device. A semiconductor chip 11 has an inner cell area 12 provided at the center portion. Formed in the inner cell area 12 are a plurality of basic cells including PMOS transistors and NMOS transistors. In this manner, various types of logic circuits may be constructed using one or more basic cells.

A plurality of external pads 14 (only sixteen pads are shown for ease of illustration) are arranged at the peripheral portion of the semiconductor chip 11 having predetermined pitches in the circumferential direction of the chip 11. Those external pads 14 are connected to multiple input/output pins of a semiconductor package by bonding wires or bumps (not shown for ease of illustration). In this embodiment, the pitches of the pads are set to the minimum value selected in accordance with the performance of the bonding machine or the test device which performs probe tests.

A plurality of input/output cell areas 13 (only sixteen areas are shown for ease of illustration) are formed on the semiconductor chip 11 between the external pads 14 and the inner cell area 12 along the line of the external pads 14. An output circuit 15 may be designed using the input/output cell areas 13. Provided above those input/output cell areas 13 is an annular power supply line 31 used to supply a low-potential voltage $V_{SS}$, an annular power supply line 33 used to for supply a high-potential voltage $V_{DD}$, an annular power supply line 32 used to supply the low-potential voltage $V_{SS}$, and an annular power supply line 34 used to supply the high-potential voltage $V_{DD}$.

Figure 4:
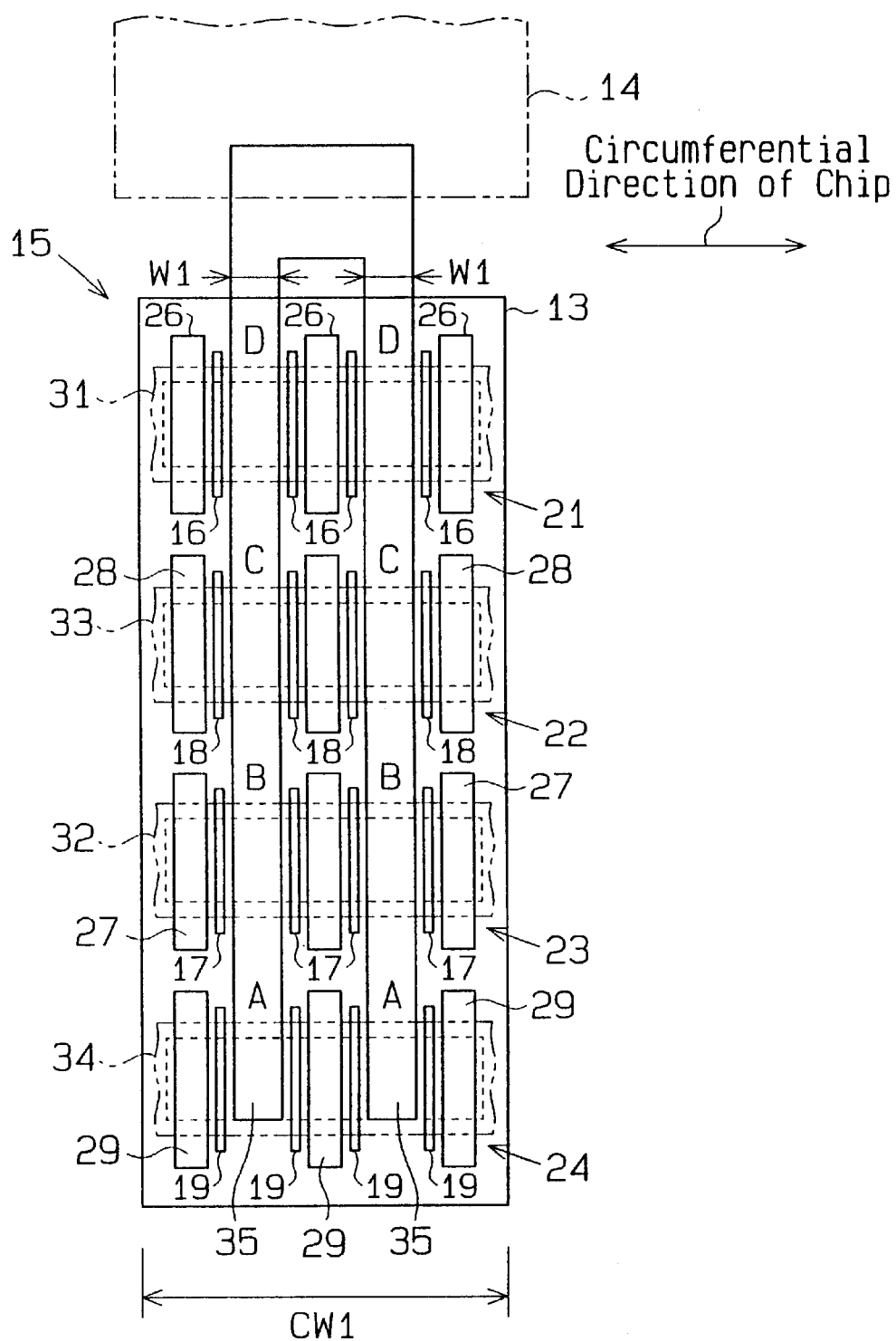
FIG. 4 is a plan view exemplifying an input/output cell area according to the first embodiment.

As shown in FIG. 4, each input/output cell area 13 has four NMOS transistors 16, four NMOS transistors 17, four PMOS transistors 18 and four PMOS transistors 19 for designing an input/output circuit. In FIG. 4, only the gates of the individual transistors are shown to illustrate the NMOS transistors 16 and 17 and the PMOS transistors 18 and 19.

A total of sixteen transistors 16, 17, 18 and 19 are separated into four transistor groups 21, 22, 23 and 24, which are arranged in a direction which is perpendicular to the circumferential direction of the semiconductor chip 11.

The first transistor group 21 consists of the four NMOS transistors 16, and the second transistor group 22 consists of the four PMOS transistors 18. The third transistor group 23 consists of the four NMOS transistors 17, and the fourth transistor group 24 consists of the four PMOS transistors 19. It is therefore apparent that each input/output cell area 13 includes a set of the first and second transistor groups 21 and 22 and a set of the third and fourth transistor groups 23 and 24.

The four MOS transistors in each transistor group 21, 22, 23 or 24 are arranged in a widthwise direction with respect to the input/output cell area 13 or in a layout direction of the plurality of input/output cell areas 13. By way of example, the leftmost transistor in any one of the transistor groups is associated with the leftmost transistors in the remaining transistor group.

Three interconnection lines 26 coupled to the sources of the four NMOS transistors 16 in the first transistor group 21 are connected to the power supply line 31 which is provided as an overlying layer configured to supply a low-potential supply voltage $V_{SS}$. Three interconnection lines 27 coupled to the sources of the four NMOS transistors 17 in the third transistor group 23 are connected to the power supply line 32 which is provided as an overlying layer configured to supply a low-potential supply voltage $V_{SS}$. Three interconnection lines 28 coupled to the sources of the four PMOS transistors 18 in the second transistor group 22 are connected to the power supply line 33 which is provided as an overlying layer configured to supply a high-potential supply voltage $V_{DD}$.

Further, three interconnection lines 29 coupled to the sources of the four PMOS transistors 19 in the fourth transistor group 24 are connected to the power supply line 34 which is provided as an overlying layer configured to supply a high-potential supply voltage $V_{DD}$.

The drains of the NMOS transistor 16 and 17 and PMOS transistor 18 and 19 which are associated with each other in the respective transistor groups 21, 22, 23 and 24 are connected to the external pads 14 via two aluminum interconnection lines 35 as common interconnection lines.

Figure 5A:
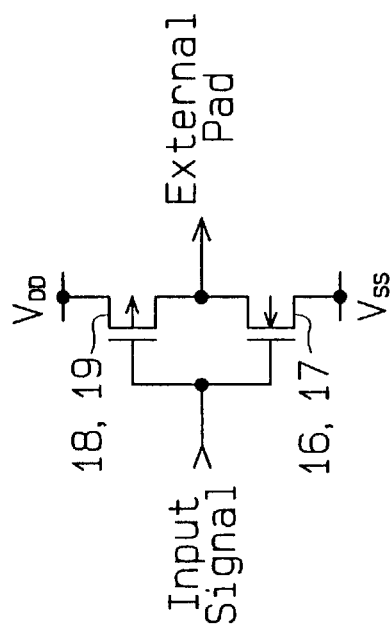
FIG. 5A is a circuit diagram of an output circuit according to the first embodiment.
Figure 5B:
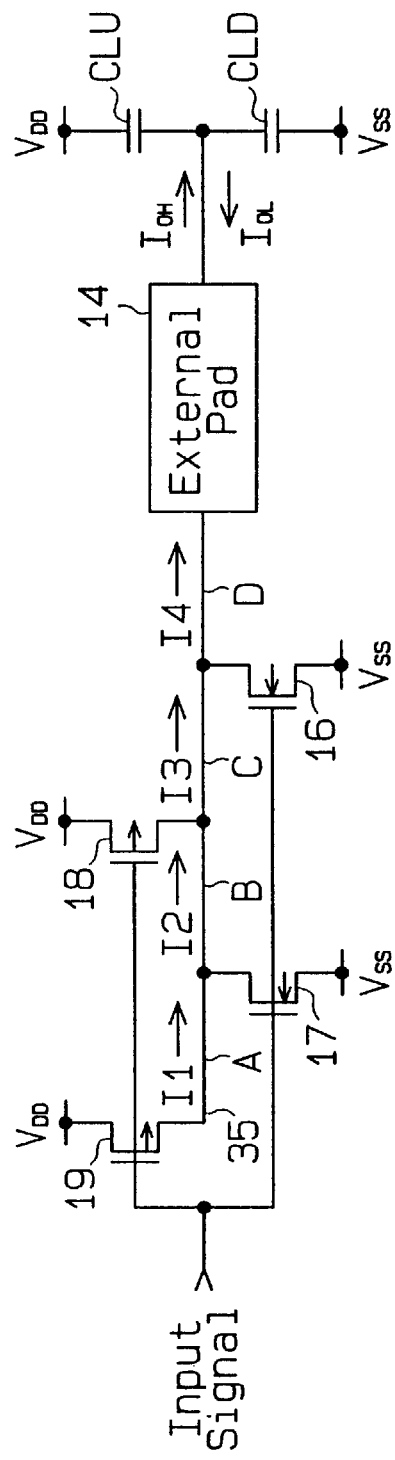
FIG. 5B is an equivalent circuit diagram which reflects the layout image of the output circuit in FIG. 5A.

FIG. 5A shows an output circuit which is formed in the input/output cell area 13 shown in FIG. 4. FIG. 5B shows an equivalent circuit which reflects the layout image of the output circuit. In FIG. 5B, the four NMOS transistors 16 are illustrated as a single collective transistor 16. Likewise, the transistors 17, 18 and 19 are illustrated as single transistors 17, 18 and 19, respectively.

In this embodiment, the line width W1 of each aluminum interconnection line 35 is selected based on the size of the transient current I1 that flows toward the external pad 14 when the two PMOS transistors 19 in the fourth transistor group 24 are turned on. In other words, when the PMOS transistors 18 and 19 in the second and fourth transistor groups 22 and 24 are turned on and the NMOS transistors 16 and 17 in the first and third transistor groups 21 and 23 are turned off in response to an L-level input signal, a charge current $I_{OH}$, is supplied to output loads CLU and CLD via the external pad 14, as shown in FIG. 5B. On the other hand, when the PMOS transistors 18 and 19 in the second and fourth transistor groups 22 and 24 are turned off and the NMOS transistors 16 and 17 in the first and third transistor groups 21 and 23 are turned on in response to an H-level input signal, a discharge current $I_{OL}$ flows in through the external pad 14 from the output loads CLU and CLD.

As a result, the current I1 which flows through a portion A of the aluminum interconnection line 35 is just the charge current which flows toward the external pad 14 via the PMOS transistor 19. The current I2 that flows through a portion B of the aluminum interconnection line 35 is the charge current which flows toward the external pad 14 via the PMOS transistor 19 plus the discharge current which flows in the NMOS transistor 17 via the external pad 14. The current I3 that flows through a portion C of the aluminum interconnection line 35 is the charge current which flows toward the external pad 14 via the PMOS transistors 18 and 19 plus the discharge current which flows in the NMOS transistor 17 via the external pad 14. Further, the current I4 that flows through a portion D of the aluminum interconnection line 35 is the charge current which flows toward the external pad 14 via the PMOS transistors 18 and 19 plus the discharge current which flows in the NMOS transistors 16 and 17 via the external pad 14.

Figure 6A:
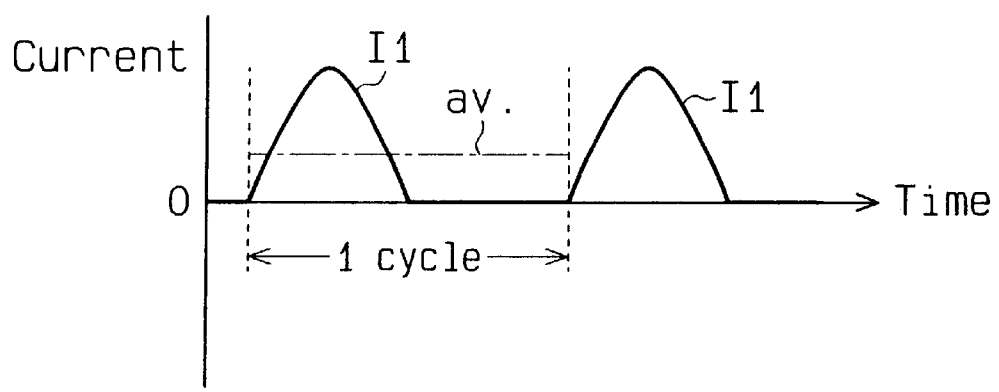
FIGS. 6A and 6B are diagrams showing current waveforms.
Figure 6B:
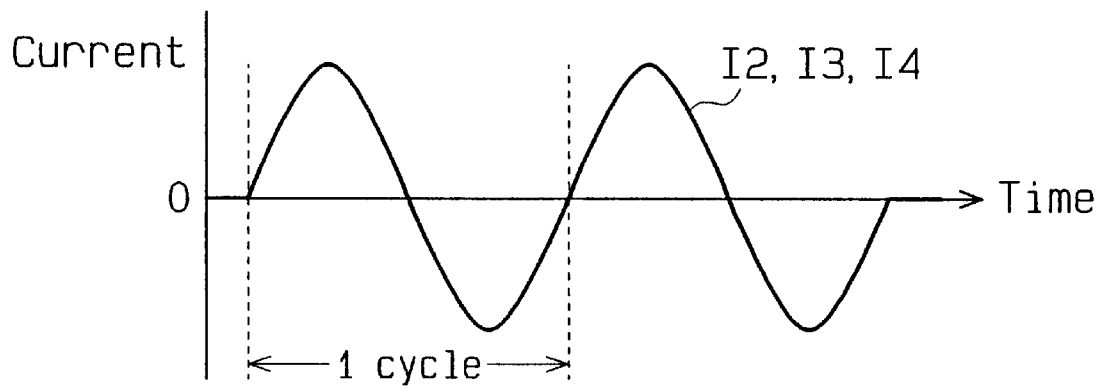

Given that the ON and OFF actions of the MOS transistor are treated as one cycle, the current I1 flowing through the portion A of the aluminum interconnection line 35 is a DC current which flows in one direction for only a half cycle, as shown in FIG. 6A. The currents I2, I3 and I4 which respectively flow through the portions B, C and D of the interconnection line 35 are AC currents which flow in two directions in one cycle, as shown in FIG. 6B.

Because electromigration is the phenomenon of the movement of aluminum atoms caused by the flow of electrons, it is expected that a portion of the aluminum interconnection line where the AC current flows has a very large current tolerance as compared to the portion where the DC current flows. As long as the line width at the portion A of the aluminum interconnection line which is the farthest from the external pad 14 is set to a value W1, this will satisfy any electromigration resistance demand. In this manner, the electromigration-originated degradation of the aluminum interconnection lines 35 may be prevented by setting the entire line width of the aluminum interconnection line 35 to W1. Further, in this embodiment, the line width W1 of the aluminum interconnection lines 35 is selected on the basis of the average value of the DC current I1 indicated by a one-dot chain line in FIG. 6A.

Further, in this embodiment, in each input/output cell area 13 of the gate array 10, the first and third transistor groups 21 and 23 including the NMOS transistors connected to the low-potential power supply $V_{SS}$ and the second and fourth transistor groups 22 and 24 including the PMOS transistors connected to the high-potential power supply $V_{DD}$ are alternately arranged in a direction that is perpendicular to the layout direction of the multiple input/output cell areas 13. Therefore, the line width W1 of the aluminum interconnection lines 35 common to the transistor groups 21 to 24 is designed on the basis of the value of the DC current that flows through the line portion A which is positioned farthest from the external pad 14. In this manner, this design scheme may enable the line width W1 of the interconnection lines 35 to be as narrow as possible while maintaining the desired electromigration resistance of the aluminum interconnection lines 35. Accordingly, the width CW1 of each input/output cell area 13 can be reduced which makes it possible to increase the number of the input/output cell areas 13 arranged in the circumferential direction of the semiconductor chip 11 and thereby ensure a more dense multipin structure of the gate array 10.

Second Embodiment

The second embodiment of this invention will be described below with reference to FIG. 7. To facilitate the following description, identical reference numerals are given to those components which are the same as the corresponding components described with reference to FIG. 4.

An input/output cell area 40 according to this embodiment is equivalent to the input/output cell area 13 of the first embodiment from which the fourth transistor group 24 and the power supply line 34 are removed. The input/output cell area 40 of the second embodiment also differs from the input/output cell area 13 of the first embodiment in that the gate width GW1 of the PMOS transistors 18 in the second transistor group 22 are selected to be wider than in the first embodiment.

In the second embodiment, the line width W2 of the aluminum interconnection lines 35 is selected based on the size of the transient current which flows in through the external pad 14 when the four NMOS transistors 17 in the third transistor group 23 are turned on.

The line width W2 of the aluminum interconnection lines 35 common to the three transistor groups 21 to 23 in the input/output cell area 40 is also selected on the basis of the value of the DC current that flows through the line portion which is positioned farthest from the external pad 14. It is therefore possible to set the line width W2 of the aluminum interconnection lines 35 as narrow as possible while maintaining the electromigration resistance of the aluminum interconnection lines 35. Accordingly, the width CW2 of each input/output cell area 40 may be reduced.

Third Embodiment

Figure 8:
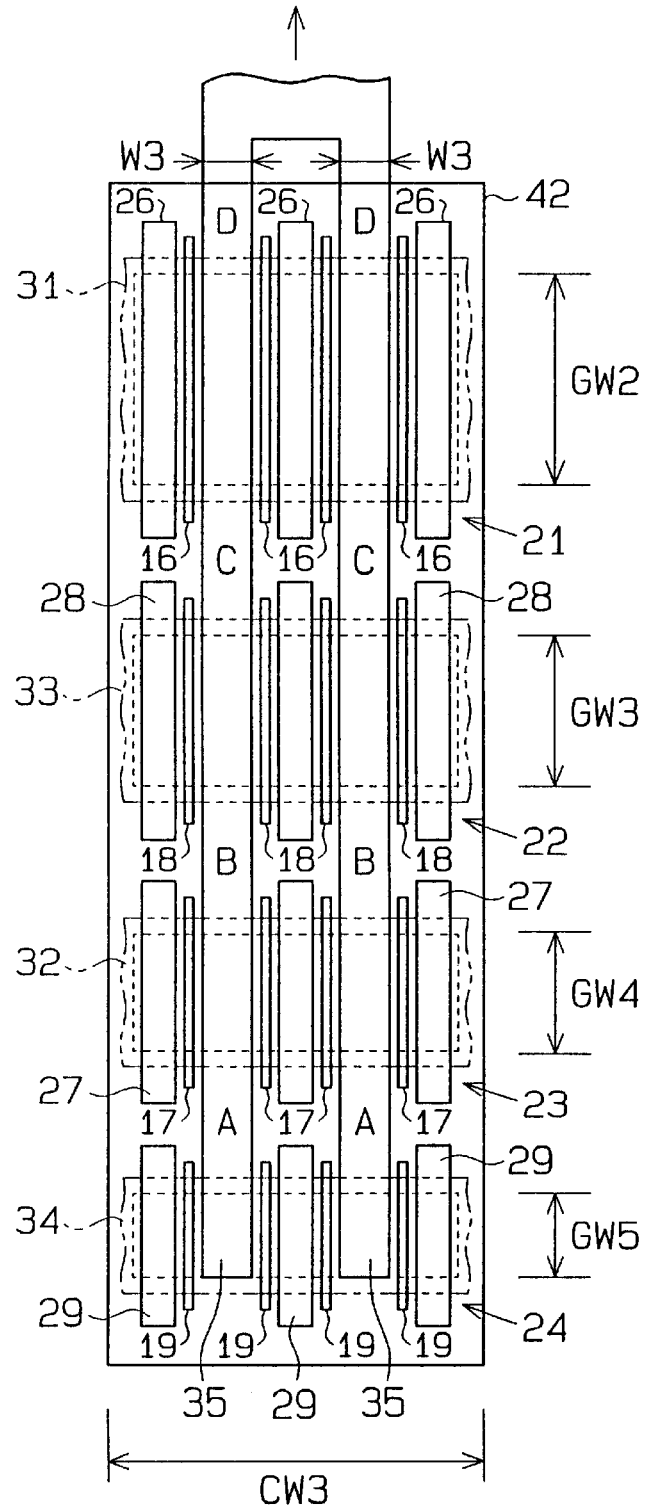
FIG. 8 is a plan view exemplifying an input/output cell area according to a third embodiment of the present invention.

The third embodiment of this invention will now be discussed with reference to FIG. 8. To facilitate the following description, identical reference numerals are given to those components which are the same as the corresponding components described with reference to FIG. 4.

In an input/output cell area 42 according to this embodiment, the gate widths GW2, GW3, GW4 and GW5 of the MOS transistors in the four transistor groups 21 to 24 differ from one another. Those gate widths are selected to become narrower as they are positioned farther away from the external pad 14. That is, the gate widths GW2, GW3, GW4 and GW5 satisfy the following relationship.

$$GW5<GW4<GW3<GW2$$

It is also possible to set the line width W3 of the aluminum interconnection lines 35 in the input/output cell area 42 of this embodiment as narrow as possible while maintaining the electromigration resistance of the interconnection lines 35 (e.g., as in the input/output cell area 13 of the first embodiment). Accordingly, the width CW3 of each input/output cell area 42 may be reduced.

If the charge and discharge currents in the input/output cell area 42 are equal to those in the input/output cell area 13 of the first embodiment, the charge current flowing through the PMOS transistors 19 in the fourth transistor group 24 in the input/output cell area 42 of the third embodiment may be reduced compared to the charge current flowing through the PMOS transistors 19 in the input/output cell area 13 of the first embodiment. In this manner, the line width W3 of the aluminum interconnection lines 35 may be designed narrower than the line width W1.

Fourth Embodiment

Figure 9:
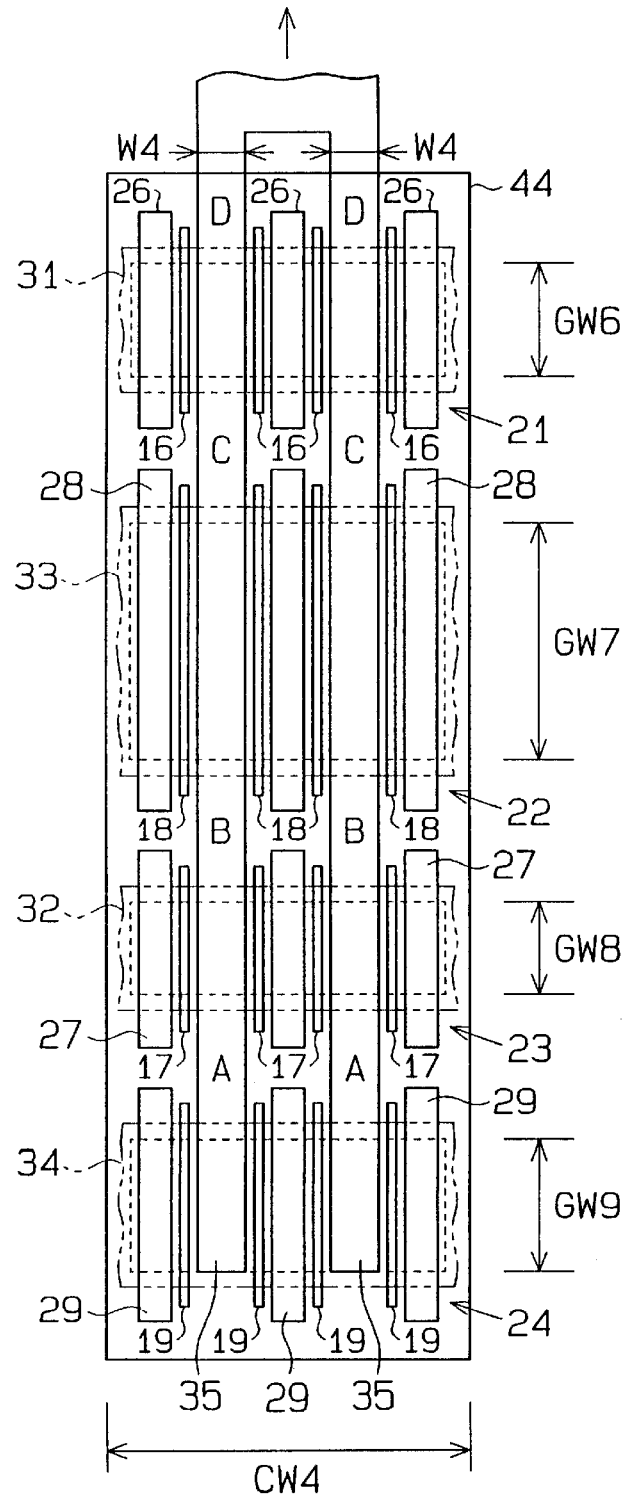
FIG. 9 is a plan view exemplifying an input/output cell area according to a fourth embodiment of the present invention.

The fourth embodiment of this invention will be now discussed referring to FIG. 9. To facilitate the following description, identical reference numerals are given to those components which are the same as the corresponding components described with reference to FIG. 4.

In an input/output cell area 44 according to this embodiment, the gate widths GW6, GW7, GW8 and GW9 of the MOS transistors in the four transistor groups 21 to 24 differ from one another. Those gate widths GW6, GW7, GW8 and GW9 satisfy the following relationships.

$GW8 < GW6$ $GW9 < GW7$ $GW6 < GW7$ $GW8 < GW9$

In the input/output cell area 44 of this embodiment, the gate width GW7 of the PMOS transistors 18 whose transient current is relatively small is set greater than the gate width GW6 of the NMOS transistors 16 whose transient current is relatively large. Likewise, the gate width GW9 of the PMOS transistors 19 is set greater than the gate width GW8 of the NMOS transistors 17. According to this design, the positive and negative amounts of the AC current which appear at portions B, C and D of each aluminum interconnection line 35 may be adjusted. It is therefore possible to further improve the electromigration resistance of the aluminum interconnection lines 35 and further reduce the line width W4 of the aluminum interconnection lines 35, thereby allowing the width CW4 of the input/output cell area 44 to be made narrower.

Fifth Embodiment

Figure 10:
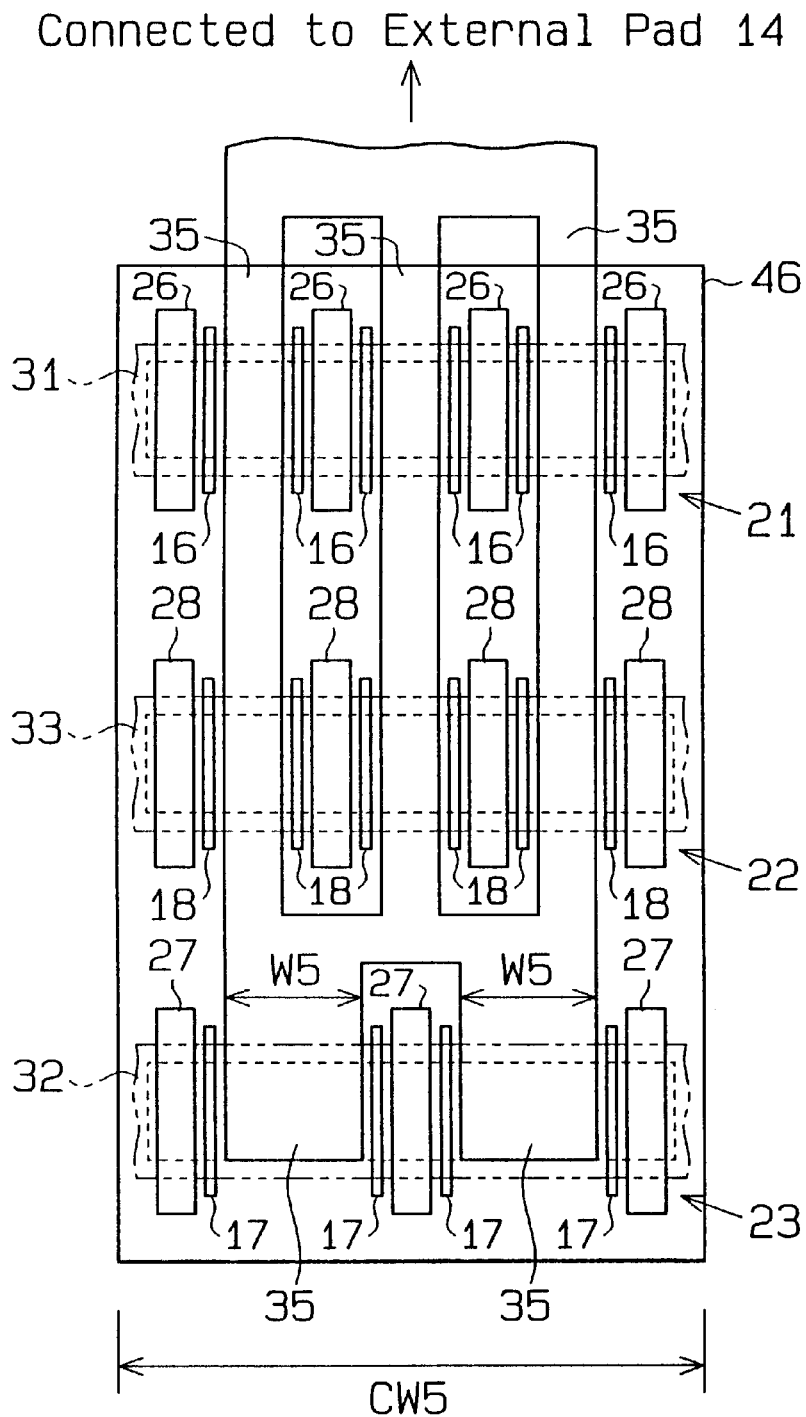
FIG. 10 is a plan view exemplifying an input/output cell area according to a fifth embodiment of the present invention.

The fifth embodiment of this invention will be now discussed with reference to FIG. 10. To facilitate the following description, identical reference numerals are given to those components which are the same as the corresponding components described with reference to FIG. 7.

An input/output cell area 46 according to this embodiment is equivalent to the input/output cell area 40 of the second embodiment in which the first transistor group 21 consists of six NMOS transistors 16, the second transistor group 22 consists of six PMOS transistors 18, and three aluminum interconnection lines 35 are laid over the first and second transistor groups 21 and 22.

The width W5 of the two aluminum interconnection lines 35 lying over the third transistor group 23 is set based on the transient current which flows through the NMOS transistors 17 of the third transistor group 23. Further, three aluminum interconnection lines 35 are provided in the vicinity of the first and second transistor groups 21 and 22 where an AC current flows through those aluminum interconnection lines 35, and the width of each of the three interconnection lines is set narrower than the width W5.

According to the input/output cell area 46 of the fifth embodiment, it is possible to set the line width W5 of the aluminum interconnection lines 35 as narrow as possible while maintaining the desired electromigration resistance of the aluminum interconnection lines 35.

Although only five embodiments of the present invention have been described herein, it should be apparent to those skilled in the art that the present invention may be embodied in many other specific forms without departing from the spirit or scope of the invention. Particularly, it should be understood that the invention may be embodied in the following forms.

The present invention may be adapted to a semiconductor device which has MOS transistor type input/output cell areas each consisting of only PMOS transistors or NMOS transistors. When the input/output cell area consists of only NMOS transistors, for example, those NMOS transistors are separated into at least three transistor groups which are arranged in the direction perpendicular to the circumferential direction of the semiconductor chip 11. Those transistor groups may be alternately connected to the high-potential power supply and the low-potential power supply according to the layout order, and the transistor groups connected to the high-potential power supply and the transistor groups connected to the low-potential power supply may be connected to external pads by common aluminum interconnection lines.

The present invention may be adapted to a semiconductor device having bipolar transistor type input/output cell areas each consisting of only PNP transistors or NPN transistors or a semiconductor device having input/output cell areas each consisting of complimentary bipolar transistors which comprise PNP and NPN transistors.

Although the first transistor group closest to the external pad consists of NMOS transistors in each input/output cell area of each of the above-described embodiments, the first transistor group may consist of PMOS transistors.

Figure 7:
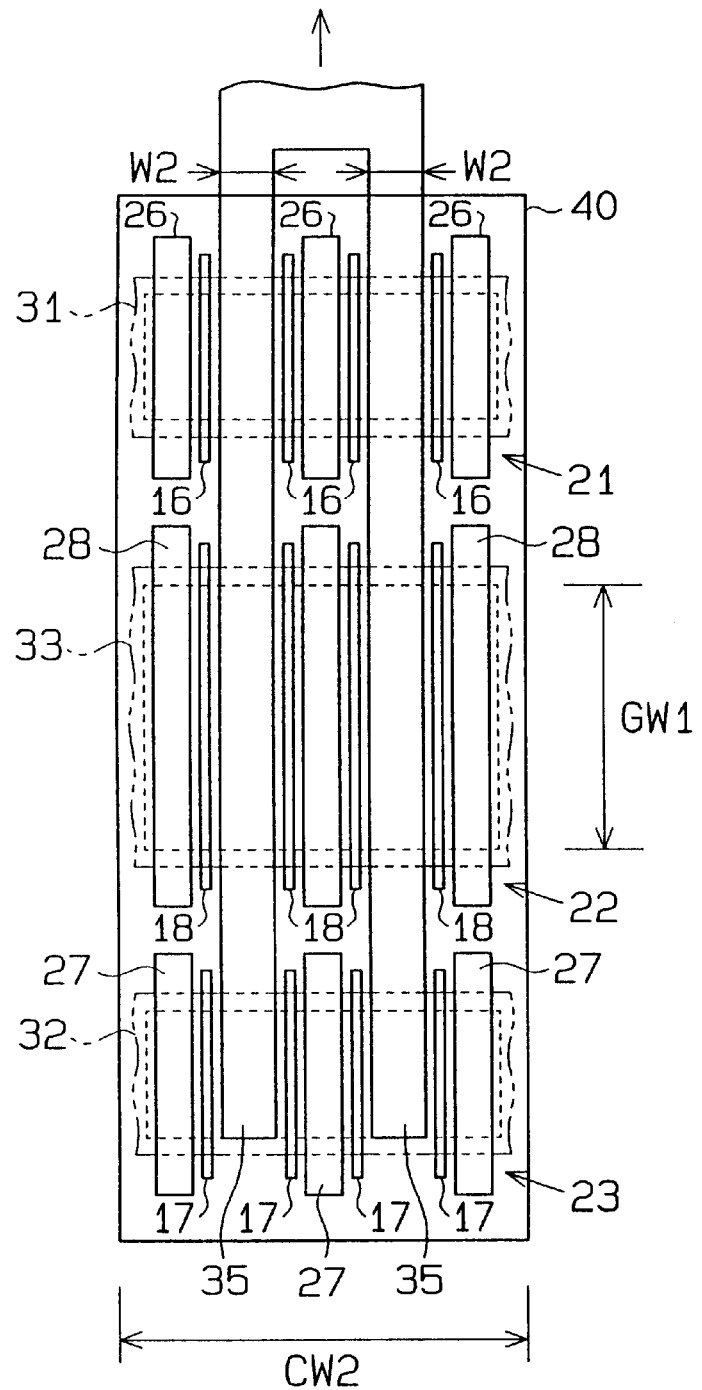
FIG. 7 is a plan view exemplifying an input/output cell area according to a second embodiment of the present invention.

In the input/output cell area 40 of the second embodiment shown in FIG. 7, the second transistor group 22 consisting of PMOS transistors may be further separated to a plurality of subgroups (e.g., two subgroups). In other words, two PMOS transistors belonging to the second transistor group 22 may be arranged in series or in parallel between each NMOS transistor of the first transistor group 21 and the associated NMOS transistor of the third transistor group 23.

Furthermore, the present invention may be adapted for use in other types of semiconductor devices besides the gate array type. In the first to fifth embodiments described above, the number of MOS transistors in each transistor group may be changed to any desired number other than four or six.

Therefore, the present examples and embodiments are to be considered as illustrative and not restrictive and the invention is not to be limited to the details given herein, but may be modified within the scope and equivalents of the appended claims.

What is claimed is:

1. A semiconductor device including a plurality of cell areas laid out along a periphery of said semiconductor device, with a plurality of transistors being formed in each cell area, said semiconductor device comprising:

at least three transistor groups formed from said plurality of transistors in each cell area and arranged in a direction perpendicular to a circumferential direction of said semiconductor device, and each of said at least three transistor groups being connected to one of a high-potential power supply and a low-potential power supply, wherein said at least three transistor groups include PMOS transistor groups and NMOS transistor groups that are alternately located; and an interconnection line connecting said at least three transistor groups to each other and being common to said at least three transistor groups, said interconnection line further connecting said at least three transistor groups to an external pad, and said at least three transistor groups being arranged in parallel with each other and wherein said at least three transistor groups are arranged such that alternate transistor groups in the direction perpendicular to the circumferential direction are of different types, wherein said MOS transistors have drains, respectively, and wherein said common intereconnection line is connected to the drains of said MOS transistors.

2. The semiconductor device according to claim 1, wherein the MOS transistor belonging to one of said at least three transistor groups located relatively apart from said periphery of said semiconductor device has a gate width that is less than a gate width of the MOS transistor belonging to one of said at least three transistor groups located relatively close to said periphery of said semiconductor device.

3. A semiconductor device including a plurality of input/output cell areas laid out along a periphery of said semiconductor device, a plurality of MOS transistors being formed in each input/output cell area, the semiconductor device comprising:

at least three transistor groups formed from said plurality of MOS transistors arranged in a direction perpendicular to a circumferential direction of said semiconductor device, and said at least three transistor groups being alternately connected to a high-potential power supply and a low-potential power supply in accordance with a layout order of said transistor groups, wherein said at least three transistor groups include PMOS transistor groups and NMOS transistor groups that are alternately located; and an interconnection line connecting said at least three transistor groups to each other and being common to said at least three transistor groups, said interconnection line connecting said three transistor groups to an external pad, and said at least three transistor groups being arranged in parallel with each other and wherein said at least three transistor groups are arranged such that alternate transistor groups in the direction perpendicular to the circumferential direction are of different type, wherein said MOS transistors have drains, respectively, and wherein said common interconnection line is connected to the drains of said MOS transistors.

4. The semiconductor device according to claim 3, wherein at least one of said transistor groups connected to said high-potential power supply comprises PMOS transistors and at least one of said transistor groups connected to said low-potential power supply comprises NMOS transistors.

5. The semiconductor device according to claim 3, wherein the MOS transistor belonging to the at least one of the transistor groups located relatively apart from said periphery of said semiconductor device has a gate width that is less than a gate width of the MOS transistor belonging to the at least one of the transistor groups located relatively close to said periphery of said semiconductor device.

6. The semiconductor device according to claim 4, wherein the PMOS transistor belonging to the at least one of the transistor groups located relatively apart from said periphery of said semiconductor device has a gate width that is less than a gate width of the PMOS transistor belonging to the at least one of the transistor groups located relatively close to said periphery of said semiconductor device; and wherein the NMOS transistor belonging to the at least one of the transistor groups located relatively apart from said periphery of said semiconductor device has a gate width that is less than a gate width of the NMOS transistor belonging to the at least one of the transistor groups which is located relatively close to said periphery of said semiconductor device.

7. The semiconductor device according to claim 3, wherein said at least three transistor groups includes two pairs of PMOS and NMOS transistor groups.

8. The semiconductor device according to claim 7, wherein said PMOS transistors in each of said transistor pairs have a gate width greater than a gate width of said NMOS transistors.

9. The semiconductor device according to claim 7, wherein said NMOS transistor groups in each of said transistor pairs are located closer than said PMOS transistor groups in each of said transistor pairs to the external pad.

10. The semiconductor device of claim 1, wherein said transistors have drains, respectively, and wherein said interconnection line is connected to said drains.

* * * * *